(12) United States Patent
Hartnett et al.

(10) Patent No.: US 6,437,587 B1
(45) Date of Patent: Aug. 20, 2002

(54) ICT TEST FIXTURE FOR FINE PITCH TESTING

(75) Inventors: Fred Hartnett, Plano; Terry Conner, Garland, both of TX (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/434,195

(22) Filed: Nov. 4, 1999

(51) Int. Cl.[7] ............................................... G01R 31/02
(52) U.S. Cl. ...................... 324/755; 324/158.1; 324/754
(58) Field of Search .............................. 324/754, 158.1, 324/751, 762, 72.5, 755, 761, 543

(56) References Cited

U.S. PATENT DOCUMENTS

| | | | | |
|---|---|---|---|---|
| 3,564,408 A | * | 2/1971 | Schulz et al. ............. | 324/158.1 |
| 4,087,747 A | * | 5/1978 | Deegen et al. ............. | 324/72.5 |
| 4,535,536 A | | 8/1985 | Wyss ........................... | 29/845 |
| 4,724,383 A | | 2/1988 | Hart ............................ | 324/158 |
| 4,977,370 A | | 12/1990 | Andrews ..................... | 324/158 |
| 5,396,186 A | * | 3/1995 | Scheutzow ................... | 324/754 |
| 5,475,317 A | * | 12/1995 | Smith .......................... | 324/760 |
| 5,477,160 A | * | 12/1995 | Love ............................ | 324/755 |
| 5,493,230 A | | 2/1996 | Swart et al. ................. | 324/754 |
| 5,534,784 A | * | 7/1996 | Lum et al. ................... | 324/757 |
| 5,600,257 A | * | 2/1997 | Leas et al. .................. | 327/754 |
| 5,623,214 A | * | 4/1997 | Pasiecznik, Jr. ............. | 324/754 |
| 5,663,655 A | | 9/1997 | Johnston et al. ............ | 324/761 |
| 5,672,978 A | * | 9/1997 | Kimura ........................ | 324/754 |
| 5,701,086 A | * | 12/1997 | Wardwell ..................... | 324/762 |
| 5,764,071 A | * | 6/1998 | Chan et al. .................. | 324/754 |
| 5,818,248 A | | 10/1998 | St. Onge ..................... | 324/761 |
| 5,821,763 A | * | 10/1998 | Beaman et al. ............. | 324/754 |
| 5,828,226 A | * | 10/1998 | Higgins et al. ............. | 324/762 |
| 5,838,159 A | * | 11/1998 | Johnson ....................... | 324/751 |
| 6,084,422 A | * | 7/2000 | Bartholomew .............. | 324/761 |
| 6,118,288 A | * | 9/2000 | Kang ........................... | 324/754 |
| 6,130,544 A | * | 10/2000 | Strid et al. ................... | 324/754 |

\* cited by examiner

Primary Examiner—Michael J. Sherry
Assistant Examiner—Jimmy Nguyen

(57) ABSTRACT

A test fixture for performing in-circuit testing of a printed circuit assembly may comprise a board having a front surface and a back surface. A probe assembly also having a front surface and a back surface is mounted to the board so that the back surface of the probe assembly is adjacent the front surface of the board. The probe assembly includes at least one front surface contact pad positioned on the front surface of the probe assembly that is electrically connected to at least one back surface contact pad positioned on the back surface of the probe assembly. A first board pad positioned on the front surface of the board makes electrical contact with the back surface contact pad on the back surface of the probe assembly. An electrical conductor operatively associated with the board electrically connects the board pad to an input/output pad that is also provided on the board.

20 Claims, 2 Drawing Sheets

ICT TEST FIXTURE FOR FINE PITCH TESTING

FIELD OF INVENTION

This invention relates to in-circuit test fixtures in general and more specifically to a high density in-circuit test fixture for fine pitch, high density circuits.

BACKGROUND

In-circuit test (ICT) probes are known in the art and are typically used to test printed circuit assemblies (i.e., PCAs) to ensure the proper functioning and operation thereof. If the printed circuit assembly or PCA successfully completes the test, it may be passed on for incorporation into the appropriate sub-assembly or into the final product, as the case may be. If, on the other hand, the PCA fails the test, it may either be repaired or scrapped.

One type of ICT probe that is commonly used today comprises a two dimensional grid or array of elongated, spring-loaded test pins or "pogo pins." The test pins or pogo pins may be arranged on a supporting board or substrate so that the pins extend generally outward from the surface of the board. The arrangement of the test pins on the board is similar to a so-called "bed of nails" and such ICT probes are often referred to as "bed of nails" probes or testers. When placed against the PCA to be tested, the various pogo pins comprising the ICT probe make contact with various circuit nodes on the PCA. Test equipment and/or circuitry electrically connected to the various pogo pins in the ICT probe thereafter tests the operation and function of the various components on the PCA to ensure proper operation.

While such two dimensional pin grid arrays or "bed of nails" testers are known and have been used with success in the past, the increasing area density (i.e., circuit node pitch) on newer PCAs makes it difficult to test all the desired circuit nodes contained on the PCA. For example, while most currently available bed of nails testers or probes have pins that are spaced on 50 mil (0.05 inch) centers, most of the new PCAs contain at least portions where the circuit node pitch is less than 50 mil. While it is possible to reduce the pin pitch somewhat, the physical dimensions of even the smallest currently available pogo pins precludes a pin pitch of less than about 35 mils. Since many of the newer PCAs may contain areas where the circuit node pitch is on the order of 10 mils to 1 mil, or even less, the currently available ICT bed of nails testers are simply not able to test all of the circuit nodes contained on the higher density portions of the PCA. In fact, with current ICT and PCA designs, it is typical that only about 70% of the circuit nodes contained on the PCA can be tested. Such limited testing means that a given PCA may pass the testing stage even though in fact it may be defective.

Another problem with currently available bed of nails ICT test fixtures is that they are difficult and time consuming to construct. The individual pogo pins of the testers are usually manually wired together and to the various required input/output nodes or terminals that are used to connect the ICT probe to the external test devices and circuitry. Therefore, even if the pitch of the pins could be reduced to 35 mils or less, such a high density pin arrangement would make it extremely difficult, if not impossible, to manually wire together the various pins according to currently used methods.

Consequently, a need exists for an ICT probe that is capable of accessing substantially all of the circuit nodes contained on the newer, high density PCAs currently being fabricated. Ideally, such an improved ICT probe should be capable of testing PCAs having circuit node pitches of 10 mils or even 1 mil. Additional advantages could be achieved if such a high density ICT probe substantially reduced or eliminated the need to hand wire together the various probe points, thereby substantially shortening the time required to fabricate an ICT probe for a given PCA design.

SUMMARY OF THE INVENTION

A test fixture for performing in-circuit testing of a printed circuit assembly may comprise a board having a front surface and a back surface. A probe assembly also having a front surface and a back surface is mounted to the board so that the back surface of the probe assembly is adjacent the front surface of the board. The probe assembly includes at least one front surface contact pad positioned on the front surface of the probe assembly that is electrically connected to at least one back surface contact pad positioned on the back surface of the probe assembly. A first board pad positioned on the front surface of the board makes electrical contact with the back surface contact pad on the back surface of the probe assembly. An electrical conductor operatively associated with the board electrically connects the board pad to an input/output pad that is also provided on the board.

Also disclosed is a method for testing a printed circuit assembly that comprises the steps of: Providing a board with a probe assembly thereon, the probe assembly having at least one electrically conductive element therein for conducting electricity from a front surface contact pad located on the probe assembly to an electrical conductor provided on the board, and placing the front surface of the probe assembly adjacent the printed circuit assembly so that the front surface contact pad makes electrical contact with a circuit node contained on the printed circuit assembly.

BRIEF DESCRIPTION OF THE DRAWING

Illustrative and presently preferred embodiments of the invention are shown in the accompanying drawing in which.

DETAILED DESCRIPTION OF THE INVENTION

Figure 1:
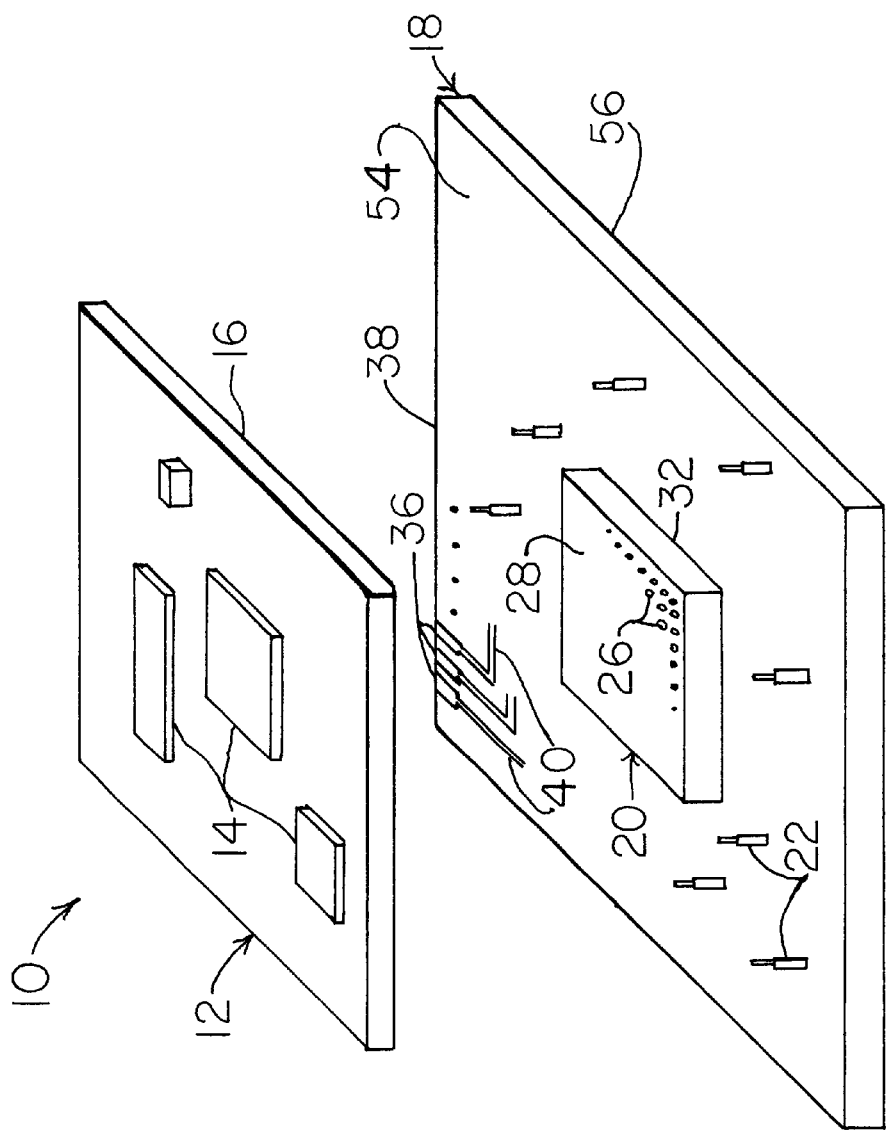
FIG. 1 is a perspective view of one embodiment of an ICT test fixture according to the present invention shown located a spaced distance from a PCA to be tested.

An ICT test fixture 10 according to the present invention is shown in FIG. 1 positioned below a printed circuit assembly (PCA) 12 to be tested. When the ICT test fixture 10 is placed into contact with a circuit node side (e.g., side 16) of PCA 12, such as by raising the ICT test fixture 10 or by lowering the printed circuit assembly 12, external circuits and/or testing equipment (not shown) connected to the ICT test fixture 10 may be used to test one or more components 14 mounted on the PCA 12 to ensure that the component or components 14 are in proper working order.

Figure 2:
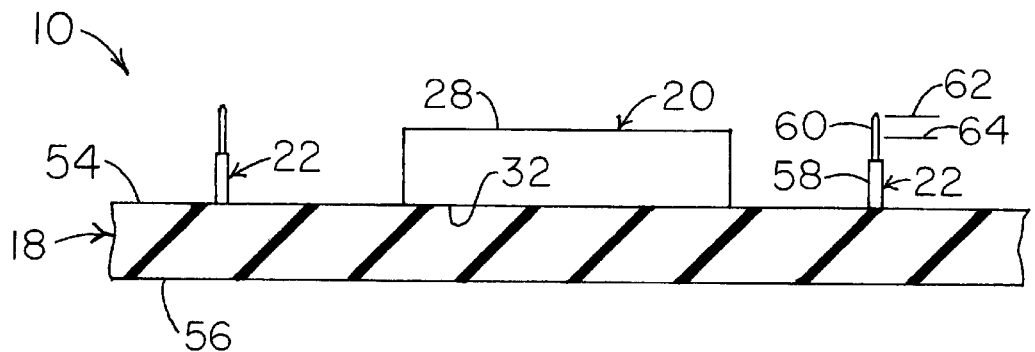
FIG. 2 is a side view in elevation of the ICT test fixture shown in FIG. 1.
Figure 3:
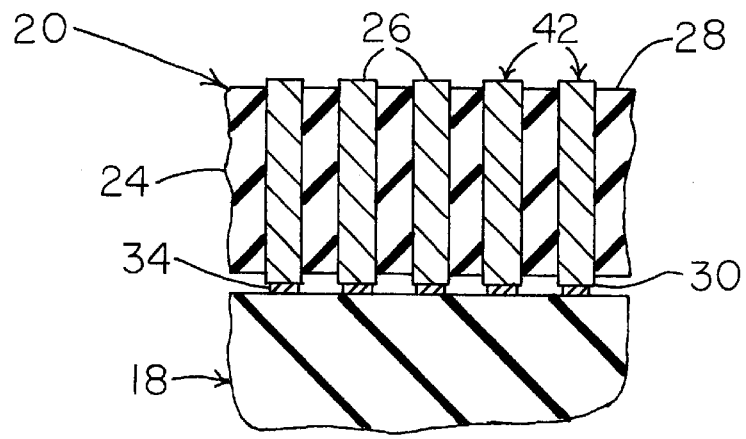
FIG. 3 is an enlarged side view in elevation of a portion of the ICT test fixture showing the arrangement of the probe assembly with respect to the board.

With reference now primarily to FIGS. 1–3, the ICT test fixture 10 may comprise a board 18 to which may be mounted a probe assembly 20 and, optionally, one or more test pins 22. The probe assembly 20 is best seen in FIG. 3 and may comprise a substrate 24 having one or more front surface contact pads 26 located on the front surface 28 of probe assembly 20 and one or more back surface contact pads 30 located on the back surface 32 of probe assembly 20. The arrangement is such that there is a one to one correspondence between the front surface contact pads 26 located on the front surface 28 of probe assembly 20 and the back surface contact pads 30 located on the back surface 32 of probe assembly 20. As will be described in greater detail below, the probe assembly 20 that may be utilized in one preferred embodiment of the invention may comprise a high density integrated circuit "socket," such as those commonly designed for use with application specific integrated circuits (ASICs), which are readily commercially available.

Still referring to FIG. 3, the board 18 may be provided with one or more board pads 34 thereon positioned so that they make electrical contact with the back surface contact pads 30 provided on the back surface 32 of probe assembly 20. One or more input/output pads 36 (FIG. 1) may also be provided on board 18 at spaced locations from the board pads 34 to allow the external test equipment and circuitry (not shown) to be connected to the test fixture 10. The input/output pads 36 may be located at any convenient position on the board 18. For example, in the embodiment shown and described herein, the input/output pads 36 may be located adjacent an edge 38 of board 18 to allow the same to be conveniently connected to the external test equipment and circuitry (not shown) via a suitable edge connector (also not shown). Alternatively, other arrangements are possible. The input/output pads 36 may be connected to the various board pads 34 by suitable conductors, such as by printed circuit conductors 40, as best seen in FIG. 1. Depending on the requirements of the particular PCA for which the test fixture 10 is to be used, various ones of the printed circuit conductors 40 may also be used to connect together one or more board pads 34 (FIG. 3), and to make any other circuit connections that may be required or desired for the particular application.

Finally, and as was mentioned above, the board 18 may also be provided with one or more test pins 22 positioned on the board 18 so that they will contact corresponding circuit nodes that may also be contained on the circuit node side 16 of printed circuit assembly 12. The test pins 22 may also be connected together and/or to appropriate input/output pads 36 by printed circuit conductors 40 provided in board 18. As will be described in greater detail below, the test pins 22 may be regarded as a "lower density" portion of test fixture 10, suitable for testing lower density portions of the PCA 12. Conversely, the probe assembly 20 may be regarded as a "higher density" portion of test fixture 10 which is better suited to test or probe higher density portions of the PCA 12, i.e., those portions of the PCA 12 wherein the circuit nodes are more closely spaced than those located in the lower density portions of the PCA 12. Accordingly, and depending on the particular PCA 12 that is to be tested, it may or may not be advantageous or desirable to provide such additional test pins 22 to provide convenient testing of lower density portions of the PCA 12.

The ICT fixture 10 according to the present invention may be used as follows to test the function and operation of the various components 14 provided on printed circuit assembly or PCA 12. As a first step in the testing process, the ICT fixture 10 and PCA 12 should be positioned adjacent one another so that the front surface 28 of probe assembly 20 is adjacent the desired conductors or circuit nodes (not shown) located on the desired circuit node side 16 of PCA 12. When the ICT fixture 10 and PCA 12 are properly positioned and aligned, the ICT fixture 10 and PCA 12 are brought together so that various ones of the front surface contact pads 26 provided on the probe assembly 20 will make electrical contact with the desired circuit nodes (not shown) contained on the circuit node side 16 of PCA 12. Similarly, if the board 18 is provided with one or more test pins 22, the test pins 22 will contact other desired circuit nodes located on the circuit node side 16 of PCA 12 as the tester 10 and PCA 12 are brought together. Thereafter, the various external testing devices and/or circuitry (not shown) connected to the ICT fixture 10 via the various input/output pads 36 will test the desired components 14 contained on the PCA 12. The components 14 may be tested according to testing procedures that are well-known in the art for such ICT testing. After the PCA 12 has been tested, the ICT fixture 10 may be separated from the PCA 12 by moving the two apart.

A significant advantage of the ICT fixture 10 according to the present invention is that it provides a means for testing high density circuit node portions of the PCA, such as those typically associated with high density integrated circuits, such as microprocessor "chips." Accordingly, the ICT fixture 10 according to the present invention allows substantially the entirety of the PCA to be tested. Another advantage of the present invention is that it dispenses with the need to manually wire together a large number of closely spaced test pins, thereby significantly speeding construction of the ICT probe as well as substantially reducing wiring errors. Still yet another advantage of the present invention is that the probe assembly 20 may comprise an "off the shelf" integrated circuit "socket" assembly, thereby further speeding fabrication and reducing costs.

Having briefly described the ICT test fixture 10 according to one embodiment of the present invention, as well as some of its more significant features and advantages, the various embodiments of the ICT test fixture according to the present invention will now be described in detail.

Referring back now to FIG. 1, one embodiment 10 of an ICT test fixture according to the present invention is shown positioned adjacent a printed circuit assembly or PCA 12 having one or more components 14 provided thereon. The ICT fixture 10 may be used to test the operation and function of the components 14 by placing the ICT test fixture 10 in contact with an appropriate circuit node side (e.g., side 16) of the PCA 12. Thereafter, external test equipment and/or circuitry (not shown) connected to the ICT test fixture 10 may be used to test the PCA 12 in accordance with testing procedures that are well known in the art.

The ICT fixture 10 may comprise a board 18 to which are mounted various higher and lower density test probe portions. For example, in the embodiment shown and described herein, the higher density test probe portion may comprise a probe assembly 20 having one or more front surface contact pads 26 provided thereon. The ICT test fixture 10 may also be provided with one or more test pins 22, which may be regarded as the lower density test probe portion. Board 18 may also be provided with one or more electrical conductors, such as printed circuit conductors 40, suitable for connecting the higher and lower density test probe portions to the external test equipment and/or circuitry.

With reference now primarily to FIGS. 2 and 3, the probe assembly 20 may comprise a substrate 24 having a front surface 28 and a back surface 32. The substrate 24 may also be provided with one or more electrically conductive elements 42 therein which extend through the substrate 24 from the front surface 28 to the back surface 32. The arrangement is such that the proximal end of each electrically conductive element 42 comprises the front surface contact pad 26, whereas the distal end of each electrically conductive element 42 comprises the back surface contact pad 30. Consequently, there is a one to one correspondence between each front surface contact pad 26 and each rear surface contact pad 30.

Figure 4:
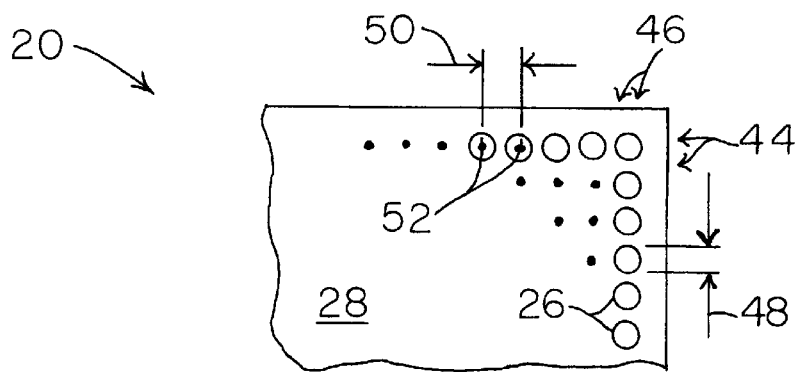
FIG. 4 is an enlarged plan view of a portion of the front surface of the probe assembly showing the arrangement of the front surface contact pads in a two dimensional array of rows and columns.

The various electrically conductive elements 42 may be arranged in the substrate 24 so that the front and back surface contact pads 26 and 30 formed thereby define any of a wide variety of configurations and patterns. For example, in the embodiment shown and described herein, the various electrically conductive elements 42 are arranged so that the front and back surface contact pads 26 and 30 define a two dimensional array of rows 44 and columns 46, as best seen in FIG. 4. Alternatively, other configurations and patterns are possible, as would be obvious to persons having ordinary skill in the art after having become familiar with the teachings of the present invention. Consequently, the present invention should not be regarded as limited to a probe assembly 20 having the particular two dimensional array of rows 44 and columns 46 shown and described herein.

The shape of each end (i.e., the front and back surface contact pads 26 and 30) of each electrically conductive element 42 may also comprise any of a wide variety of shapes (e.g., circular, square, polygonal, etc.) as would be obvious to persons having ordinary skill in the art after having become familiar with the teachings of the present invention. Consequently, the present invention should not be regarded as limited to front and back side contact pads 26 and 30 having any particular shape. However, by way of example, in one preferred embodiment, each of the front and back surface contact pads 26 and 30 may have a substantially circular configuration with a diameter 48 in the range of about 18 mils to about 24 mils (22 mils preferred). The front and back surface contact pads 26 and 30 should be spaced so that the distance or pitch 50 between the centers 52 of adjacent pads in a row 44 or column 46 is in the range of about 35 mils to about 45 mils (39 mils preferred). Also, it is generally preferred, but not required, that the spacing or pitch 50 between adjacent front or back surface contact pads 26 and 30 should be about equal between rows 44 and columns 46, although this need not be the case.

The substrate 24 comprising the probe assembly 20 may be fabricated from any of a wide range of electrically insulating materials that are now known or that may be developed in the future and that would be suitable for the intended application. By way of example, in one preferred embodiment, the substrate 24 is fabricated from an insulating material generically known in the industry as "FR4," although other materials could be used. The electrically conductive elements 42 contained in the substrate 24 may be made from any of a wide range of electrically conductive materials (e.g., metals or metal alloys) that are now known in the art or that may be developed in the future, and the present invention should not be regarded as limited to conductors 42 having any particular composition. However, by way of example, the electrically conductive elements 42 in one preferred embodiment of the invention are formed from copper.

Depending on the particular material that is used to form the conductors 42, it may be desirable to coat the portion of the conductor 42 that forms the front surface contact pad 26 with a corrosion and oxidation resistant material (such as gold) to ensure that reliable electrical contact is made with the desired circuit node contained on the PCA 12. It is also generally preferred that any such corrosion resistant material have a relatively high hardness to ensure that the front surface contact pads 26 will not become deformed as a result of repeated testing. With the foregoing considerations in mind, the front surface contact pads 26 may be coated with a tin-lead alloy, although other materials may also be used.

The probe assembly 20 that may be used in one preferred embodiment may be custom fabricated or may comprise an "off the shelf" component. In one preferred embodiment, the probe assembly 20 comprises a custom fabricated component. Alternatively, the probe assembly 20 may comprise a "socket" assembly designed for use with application specific integrated circuits (ASICs) and that is generically referred to as an "ASIC socket." Such ASIC sockets are not sockets in the strict sense of the word in that they do not contain any holes or socket-like members configured to receive component leads. Instead, such ASIC sockets comprise members substantially in the form shown and described herein, with a plurality of thru conductors (e.g., conductors 42) the ends of which form the front and back surface contact pads (e.g., 26 and 30) and which are arranged in a two dimensional array of rows and columns (e.g., rows 44 and columns 46). The ASIC socket utilized in one preferred embodiment of the present invention is available from the Augat Division of Thomas & Betts of Memphis, Tenn., as model no. 0000006762. Alternatively, other types of ASIC sockets available from other manufactures may also be used.

Referring now primarily to FIGS. 1 and 2, with occasional reference to FIG. 3, the board 18 to which the probe assembly 20 is mounted may comprise a generally rectangularly shaped member having a front surface 54 and a back surface 56. The board 18 may be sized and shaped so that the probe assembly 20, along with any test pins 22, may be positioned on the board 18 so as to be aligned with the desired circuit nodes (not shown) contained on the particular PCA 12 that is to be tested. Since the size and shape of the board 18 is tied to the size and shape of the PCA 12 that is to be tested, the board 18 according to the present invention should not be regarded as limited to any particular configuration.

The front surface 54 of board 18 may be provided with one or more board pads 34 (FIG. 3) thereon positioned so that they make electrical contact with the back surface contact pads 30 provided on the back surface 32 of probe assembly 20. The board 18 may also be provided one or more input/output pads 36 (FIG. 1) which may be positioned at spaced locations from the board pads 34 to allow the external test equipment and circuitry (not shown) to be connected to the test fixture 10. The input/output pads 36 may be positioned at any convenient locations on either the front or back surfaces 54 and 56 of board 18, as would be obvious to persons having ordinary skill in the art after having become familiar with the teachings of the present invention. By way of example, in one preferred embodiment, the input/output pads 36 may be located adjacent an edge 38 of board 18 to allow the same to be conveniently connected to the external test equipment and circuitry (not shown) via a suitable edge connector (also not shown). The input/output pads 36 may be connected to the various board pads 34 by suitable conductors, such as by printed circuit conductors 40, as best seen in FIG. 1. Depending on the requirements of the particular PCA for which the test fixture 10 is to be used, various ones of the printed circuit conductors 40 may also be used to connect together one or more board pads 34 (FIG. 3), and to make any other circuit connections that may be required or desired for the particular application.

The board 18 may comprise a printed wiring board that is custom designed for the particular PCA 12 that is to be tested. Accordingly, the board 18, the board pads 34, input/output pads 36, and printed circuit conductors 40 may comprise materials that are well-known in the art for such purposes and may be fabricated according to any of a wide variety of techniques that are well-known in the art for fabricating such printed wiring boards. Consequently, the particular materials and fabrication techniques that may be utilized to fabricate the board 18 utilized in one preferred embodiment of the present invention will not be described in further detail herein.

Due to the large number of connections that are involved in a typical application, it will usually, but not necessarily always, be necessary to fabricate the board 18 with a plurality of separate wiring layers. Here again, since fabrication techniques for fabricating multi-layer printed wiring boards are also well-known in the art, the particular fabrication techniques that may be used to fabricate a multi-layer board which may be required in a particular application also will not be described in further detail herein.

In many situations it will be preferred, but not required, to also provide the board 18 with one or more test pins 22 positioned to contact corresponding circuit nodes that may also be contained on the circuit node side 16 of printed circuit assembly 12. The test pins 22 may also be connected together and/or to appropriate input/output pads 36 by printed circuit conductors 40 provided in board 18.

Referring now primarily to FIG. 2, each test pin 22 ay be substantially identical to the others and may comprise a body portion 58 mounted to the board 18 so that the test pin 22 extends generally outwardly from the front surface 54 of board 18. Each test pin 22 may also include a tip portion 60 that is slidably mounted to the body portion 58 so that the tip portion 60 may move axially with respect to the body portion 58 between an extended position 62 and a retracted position 64. A spring (not shown) positioned within the body portion 58 of test pin 22 biases the tip portion 60 toward the extended position 62. The moveable tip portion 60 allows the test pin 22 to contact the desired circuit node (not shown) located on the PCA 12 and then retract as necessary as the PCA 12 and ICT fixture 10 are moved together to allow the front surface contact pads 26 on the probe assembly 20 to make electrical contact with the other desired circuit nodes contained on the PCA 12.

The test pins 22 may comprise any of a wide range of test pins that are well-known in the art and that are readily commercially available. In one preferred embodiment, the test pins 22 may comprise test pins available from QA Technology Company, Inc. of Hampton, NH, as model no. 050-PTP2558-SS. Alternatively, other types of test pins that are now known in the art or that may be developed in the future may be substituted for the test pins 22 shown and described herein.

As was mentioned above, the test pins 22 may be regarded as a "lower density" portion of test fixture 10 in that their larger size precludes them from effectively testing circuit nodes contained on the PCA 12 that are spaced less than about 50 mils apart. However, the high density of front surface contact pads 26 located on the probe assembly 20 allows the probe assembly 20 to effectively access circuit nodes having spacings as close as 1 mil. Accordingly, the probe assembly 20 may be regarded as a "higher density" portion of test fixture 10 since it is well-suited to test or probe higher density portions of the PCA 12. Therefore, and depending on the particular PCA 12 that is to be tested, it may or may not be advantageous or desirable to provide such additional test pins 22 to provide convenient testing of lower density portions of the PCA 12.

The ICT fixture 10 according to the present invention may be used according to the following process to test the function and operation of the various components 14 provided on printed circuit assembly or PCA 12. As a first step in the process, the ICT fixture 10 and PCA 12 should be positioned adjacent one another and aligned so that the front surface contact pads 26 contained on the front surface 28 of probe assembly 20 are adjacent the desired circuit nodes (not shown) located on the circuit node side 16 of PCA 12. Any of a wide range of alignment devices and machines that are wellknown in the art may be used to so align the test fixture 10 with the PCA 12. Once the ICT fixture 10 and PCA 12 are properly aligned, the fixture 10 and PCA 12 may be moved together until the various ones of the front surface contact pads 26 provided on the probe assembly 20 make electrical contact with the appropriate circuit nodes (not shown) contained on the circuit node side 16 of PCA 12. If the board 18 is provided with one or more test pins 22, the test pins 22 will contact other circuit nodes located on the circuit node side 16 of PCA 12. The moveable tip portions 60 will retract slightly as the test fixture 10 and PCA 12 are brought together so that the front surface contact pads 26 will make electrical contact with the other desired circuit nodes contained on the PCA 12. Thereafter, the various external testing devices and/or circuitry (not shown) connected to the ICT fixture 10 via the various input/output pads 36 will test the desired components 14 contained on the PCA 12. The components 14 may be tested according to testing procedures that are well-known in the art for such ICT testing. After the PCA 12 has been tested, the ICT test fixture 10 may be separated from the PCA 12 by moving the two apart.

This completes the detailed description of the various preferred embodiments of the present invention. While a number of specific components were described above for the preferred embodiments of this invention, persons having ordinary skill in the art will readily recognize that other substitute components or combinations of components may be available now or in the future to accomplish comparable functions to the various components shown and described herein. For example, while the ICT test fixture 10 is shown and described herein having a single probe assembly 20, additional probe assembly assemblies may also be provided on the board 18 to test additional higher density portions of the particular PCA 12. Such additional probe assembly assemblies may or may not have the same number and configuration of front surface contact pads 26 as those shown and described herein.

In accordance with the foregoing considerations, then, it is contemplated that the inventive concepts herein described may be variously otherwise embodied and it is intended that the appended claims be construed to include alternative embodiments of the invention except insofar as limited by the prior art.

What is claimed is:

1. A test fixture for testing a printed circuit assembly, comprising:
  a board having a front surface and a back surface;
  a probe assembly having a front surface and a back surface, said probe assembly being mounted to said board so that the back surface of said probe assembly is adjacent the front surface of said board, said probe assembly including at least one front surface contact pad positioned on the front surface of said probe assembly and at least one back surface contact pad positioned on the back surface of said probe assembly, said at least one back surface contact pad being aligned with said at least one front surface contact pad, said at least one front surface contact pad being electrically connected to said at least one back surface contact pad;

a first board pad positioned on the front surface of the board so that the first board pad makes electrical contact with said at least one back surface contact pad on the back surface of said probe assembly;

an input/output pad positioned on the board so that said input/output pad is located a spaced distance from said first board pad;

at least one electrical conductor operatively associated with said board, said at least one electrical conductor electrically connecting said first board pad and said input/output pad.

2. The test fixture of claim 1, wherein said at least one electrical conductor comprises a printed circuit conductor.

3. The test fixture of claim 2, wherein said first board pad and said input/output pad comprise integral portions of said printed circuit conductor.

4. The test fixture of claim 3, wherein said input/output pad is positioned about at an edge of said board, the edge of said board being sized to receive a board edge connector, said input/output pad being sized and positioned to make electrical contact with said board edge connector.

5. The test fixture of claim 1, further comprising at least one test pin mounted to said board so that said test pin extends generally outwardly from the front surface of said board, said at least on e test pin making electrical contact with a circuit node contained on the printed circuit assembly when said board is positioned in a test position adjacent the printed circuit assembly.

6. The test fixture of claim 5, wherein said at least one test pin comprises a body portion mounted to said board and a tip portion slidably mounted to said body portion so that said tip portion moves axially with respect to said body portion between an extended position and a retracted position.

7. The test fixture of claim 6, further comprising a spring mounted within said body portion of said test pin, said spring biasing said tip portion in the extended position.

8. The test fixture of claim 1, further comprising a plurality of front surface contact pads arranged on the front surface of said probe assembly so that said plurality of front surface contact pads form a two-dimensional array having at least one row and one column.

9. The test fixture of claim 8, wherein each front surface contact pad has a center point and wherein said plurality of front surface contact pads are positioned on the front surface of said probe assembly so that a distance between center points on adjacent front surface contact pads in the row is in the range of about 35 mils to about 45 mils.

10. The test fixture of claim 9, wherein each front surface contact pad comprises a substantially circular member having a diameter.

11. The test fixture of claim 10, wherein the diameter of each front surface contact pad is in the range of about 18 mils to about 24 mils.

12. The test fixture of claim 1, wherein said probe assembly comprises:

a substantially non-electrically conductive substrate that defines the front and back surfaces of said probe assembly, said substrate having a plurality of holes extending therethrough from the front surface to the back surface; and an electrically conductive element having a proximal end and a distal end positioned in each of said plurality of holes, wherein the proximal end of said electrically conductive element comprises the front surface contact pad and wherein the distal end of said electrical conductive element comprises the back surface contact pad.

13. The test fixture of claim 12, wherein said plurality of holes in said substrate form a two dimensional array having at least one row and at least one column.

14. The test fixture of claim 13, wherein each of said plurality of holes has a central axis and wherein said plurality of holes are positioned in said substrate so that a distance between the central axes of two adjacent holes in a row is in the range of about 35 mils to about 45 mils.

15. The test fixture of claim 14, wherein each of said plurality of holes comprises a substantially circular hole having a diameter.

16. The test fixture of claim 15, wherein the diameter of each of said plurality of holes is in the range of about 18 mils to about 24 mils.

17. The test fixture of claim 1, wherein said probe assembly comprises a socket for an application specific integrated circuit.

18. In a test fixture of the type used for in circuit testing of printed circuit assemblies, said test fixture having a board with a front surface and a back surface for making electrical contact with a circuit node on the printed circuit assembly when the front surface of the board is positioned adjacent the printed circuit assembly, the improvement comprising:

a probe assembly having a front surface and a back surface, said probe assembly being mounted to the board so that the back surface of said probe assembly is adjacent the front surface of the board, said probe assembly including a plurality of front surface contact pads positioned on the front surface of said probe assembly and a plurality of back surface contact pads positioned on the back surface of said probe assembly, each of said plurality of back surface contact pads being aligned with a corresponding one of each of said plurality of front surface contact pads, each of said plurality of front surface contact pads being electrically connected to a corresponding back surface contact pad so that there is a one-to-one correspondence between the plurality of front surface contact pads and the plurality of back surface contact pads;

a first board pad positioned on the front surface of the board so that the first board pad makes electrical contact with a back surface contact pad on the back surface of said probe assembly;

an input/output pad positioned on the board so that said input/output pad is located a spaced distance from said first board pad; and at least one electrical conductor operatively associated with said board, said at least one electrical conductor electrically connecting said first board pad and said input/output pad.

19. In a test fixture of the type used for in circuit testing of printed circuit assemblies, said test fixture having a board with a front surface and a back surface, the improvement comprising:

a first board pad positioned on the front surface of the board;

an input/output pad positioned on the board a spaced distance from said first board pad;

electrical conductor means operatively associated with said board for electrically connecting said first board pad and said input/output pad; and constant pitch probe assembly means mounted to the board for defining at plurality of front surface contacts and a plurality of back surface contacts, each of the plurality of back surface contacts being aligned with a corresponding one of said plurality of front surface contacts, and for conducting electricity from a circuit node on the printed circuit assembly to said first board pad on the board.

20. A method for testing a printed circuit assembly having at least one circuit node contained thereon, comprising:

providing a board having a front surface, a back surface, and a probe assembly thereon, said probe assembly having at least one electrically conductive element therein for conducting electricity from a front surface contact pad located on a front surface of the probe assembly to a back surface contact pad located on a back surface of the probe assembly, said back surface contact pad being aligned with said front surface contact pad, said back surface contact pad being in electrical contact with said board; and placing the front surface of the probe assembly adjacent the printed circuit assembly so that the front surface contact pad makes electrical contact with a circuit node contained on the printed circuit assembly.

* * * * *